United States Patent [19]

Iwahashi et al.

[11] Patent Number: 5,197,087

[45] Date of Patent: Mar. 23, 1993

[54] SIGNAL ENCODING APPARATUS

[76] Inventors: Naoto Iwahashi; Masayuki Nishiguchi; Makoto Akune; Kenzo Akagiri; Yoshihito Fujiwara, all of c/o Sony Corporation 7-35, Kitashinagawa 6-Chome, Shinagawa-Ku, Tokyo, Japan

[21] Appl. No.: 553,608

[22] Filed: Jul. 18, 1990

[30] Foreign Application Priority Data

Jul. 19, 1989 [JP] Japan .................. 1-186603

[51] Int. Cl.$^5$ .............................................. H04B 1/66
[52] U.S. Cl. .................... 375/122; 370/109; 370/118; 381/29; 358/433
[58] Field of Search .................. 375/122; 370/83, 109, 370/118, 82; 381/29, 30; 341/67; 358/433

[56] References Cited

U.S. PATENT DOCUMENTS

| | | | |
|---|---|---|---|
| 4,495,620 | 1/1985 | Steele et al. | 375/122 |
| 4,754,492 | 6/1988 | Malvar | 358/433 |
| 4,791,654 | 12/1988 | De Marca et al. | 381/29 |
| 4,878,230 | 10/1989 | Murakami et al. | 375/122 |
| 4,985,700 | 1/1991 | Mikami | 341/67 |
| 5,051,840 | 9/1991 | Watanabe et al. | 358/433 |

OTHER PUBLICATIONS

ICASSP '89, vol. 3, Jun. 23, 1989, Glasgow UK, pp. 1854-1857; C. T. Chen: 'Adaptive Transform Coding via Quadtree-based Variable Blocksize DCT', paragraph II.

IEEE Transactions on Acoustics, Speech and Signal Processing, vol. 25, No. 4, Aug. 1977, New York US pp. 322-330; S. Chandra et al.: 'Linear Prediction With a Variable Analysis Frame Rate', paragraph "Calculation of Analysis Frame Rate", paragraphs Extraction of Transmission Parameters, FIGS. 2-3.

IEEE Transaction on Acoustics, Speech and Signal Processing, vol. 25, No. 4, Aug. 1977, New York US, pp. 299-309; R. Zelinski et al.: 'Adaptive Transform Coding of Speech Signals', paragraph I.C.-paragraph I.E.; FIG. 3.

*Primary Examiner*—Curtis Kuntz
*Assistant Examiner*—Young Tse
*Attorney, Agent, or Firm*—Lewis H. Eslinger; Jay H. Maioli; Donald S. Dowden

[57] ABSTRACT

A signal encoding apparatus for cutting out blocks of an input signal waveform at a predetermined time interval and converting the in-block signal by mutually independent conversion axes for encoding, wherein the waveform cutting block length along the time axis is changed according to the input signal.

4 Claims, 2 Drawing Sheets

SIGNAL ENCODING APPARATUS

BACKGROUND OF THE INVENTION

1. Field of the Invention

This invention relates to a signal encoding apparatus for compressing and encoding input signals, such as voice signals, and, more particularly, to a signal encoding apparatus for orthogonally converting and encoding input signals.

2. Description of the Prior Art

In orthogonal conversion processes employed in conversion encoding which is among the signal compression encoding techniques, specific techniques include discrete Fourier transform (DFT), Hadamard transform, Karhunen Leve transform (KLT), discrete cosine transform (DCT) and Legendre transform. These orthogonal transforms convert the sample values into mutual orthogonal axes for removing (or reducing) correlation among the sample values or concentrating the signal energies to certain coefficients and represent one of the compression artifices for data, such as sound or video image.

Among these orthogonal transforms, the above discrete Fourier transform is such a transform in which the signal after the transform is an expression on the frequency axis of the original signal expression on the time axis, so that the control of the S/N ratio on the frequency axis at the time of quantizing the converted signal is facilitated. Thus, in application to voice signals, encoding under utilization of the characteristics or the frequency axis of the human auditory sense is possible so that the S/N ratio may be improved as long as the auditory sense is concerned. In application to video signals, human visual characteristics differ between the low frequency component and the high frequency component so that, after converting the input video signals into these components, encoding suited thereto may be made to realize effective compression.

In such an orthogonal compression system, conversion is on the block-by-block basis, with input signals being divided at predetermined lengths on the time axis or on the frequency axis, with the block length being of a constant value. This block length has been determined in consideration of the statistic properties of the input signals, that is, the properties of typical input signals. For example, in the case of musical signals, the block length is determined on the basis of the above mentioned human auditory properties, whereas, in the case of video signals, the block length is determined on the basis of the human visual properties.

However, in effect, actual input signals, such as voice or image signals, are changed in their properties, such as in levels, so conspicuously with time that the preset block length may not be optimum at a certain time. Therefore, when such input signal is orthogonally converted at the predetermined length of the block and the thus converted signal is decoded, the S/N ratio may be degraded.

OBJECT AND SUMMARY OF THE INVENTION

The present invention has been proposed with the above status in mind and aims at providing a signal encoding apparatus in which the decoded signal of higher quality (higher S/N ratio) may be obtained despite fluctuations in the input signal properties.

The present invention has been proposed for accomplishing the above object and aims at providing a signal encoding apparatus for cutting out blocks of an input signal waveform at a predetermined time interval and converting the in-block signal by mutually independent (or orthogonal) conversion axes for encoding, wherein the waveform cut-out block length along the time axis is changed according to the input signal, above all, to the properties of the input signal.

According to the present invention, the block length of the orthogonal conversion is adaptively changed according to the properties of the input signal. That is, the optimum block length is selected according to the properties of the input signal so that the S/N ratio is improved.

That is, the waveform cutting block length along the time axis is changed adaptively in dependence upon the input signal, so that a block length best suited to the input signal properties is selected and hence the decoded signal of a higher quality (high S/N ratio) may be obtained upon decoding despite fluctuations in the input signal properties.

DESCRIPTION OF THE PREFERRED EMBODIMENTS

Figure 1:
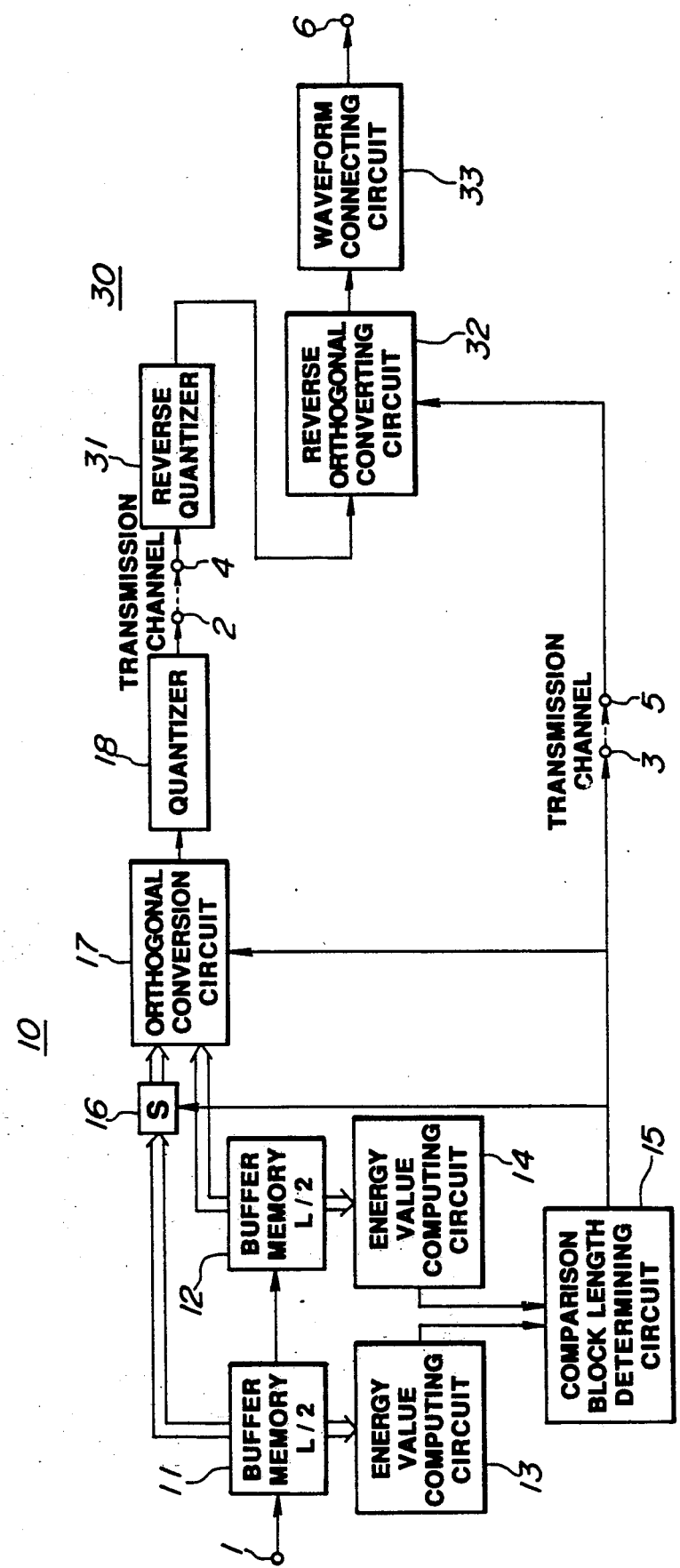
FIG. 1 is a block circuit diagram showing a schematic construction of an apparatus according to an embodiment of the present invention.

Two embodiments of the present invention will be hereinafter explained by referring to the drawings.

FIG. 1 shows a general construction of an apparatus embodying the present invention. The basic flow of the signal processing in the apparatus of the present embodiment is briefly explained.

That is, referring to FIG. 1, an input signal is supplied to an input terminal 1 of an encoder 10. The signal waveform of this input signal is sequentially stored in buffer memories 11, 12 so as to be supplied from the memories 11, 12 to an orthogonal conversion circuit 17 as a data group blocked at a predetermined time interval. The data at this time are so arranged that the block length cut out along the time axis is changed in accordance with the input signal. In the orthogonal conversion circuit 17, the signal waveform on the block-by-block basis is converted into a signal on the frequency axis that is orthogonal to the time axis.

In the apparatus of the present embodiment, the energy value of the signal stored in the buffer memories 11, 12 is computed in energy value computing circuits 13, 14, the energy value is transmitted to a block length determining circuit 15, where the data indicating the block length based on the energy value is formed. The thus formed block length data are transmitted to the orthogonal conversion circuit 17 where the input signal (buffer memory output) is processed by, for example, discrete Fourier transform (DFT) with the block length based on the above mentioned block length data for conversion into signals on the frequency axis. A DFT coefficient is produced from the orthogonal conversion circuit 17 and transmitted to a quantizer 18 where it is quantized and transmitted via output terminal 2 to a terminal 4 of a decoder 30 over a transmission channel.

When data outside of the in-block data are necessitated at the time of window processing for cutting out the input signal waveform based on the above mentioned block length data, data exceeding the range of the intrinsic block may be adapted to be forwarded from the buffer memories 11, 12.

In the decoder 30, an operation which is the reverse of the above mentioned quantization and orthogonal conversion is performed at the reverse quantizer 31 and the reverse orthogonal converting circuit 32. That is, at the reverse quantizer 31, the DFT coefficient obtained at the quantizer 18 is reverse-quantized and, in the reverse orthogonal conversion circuit 32, the signal is restored from the reverse quantized DFT coefficient. To the reverse orthogonal conversion circuit 32, the above mentioned block length data found at the block length determining circuit 15 of the encoder 10 is supplied via terminal 3, transmission channel and terminal 5 are supplied at this time, so that, in the signal restoration carried out in the reverse orthogonal conversion circuit 32, the DFT coefficient on the block-by-block basis based on the block length data is converted by orthogonal conversion into a signal waveform on the time axis. The signal waveforms on the time axis are sent to a waveform connecting circuit 33 where the signal waveforms are sequentially interconnected so as to be output at the output terminal 6 as the decoded signal.

In general, the orthogonal conversion has the characteristics of removing (or diminishing) correlations among sample values or of concentrating signal energies in certain coefficients. For example, in discrete Fourier transform, there is a property that the S/N ratio may be controlled more easily on the frequency axis when quantizing the post-conversion signals, as mentioned above. Hence, with the apparatus of the present example, encoding may be made with utilization of a human auditory sense, in the case of audio signals, so that the S/N ratio in the auditory sense may be improved.

Figure 2:
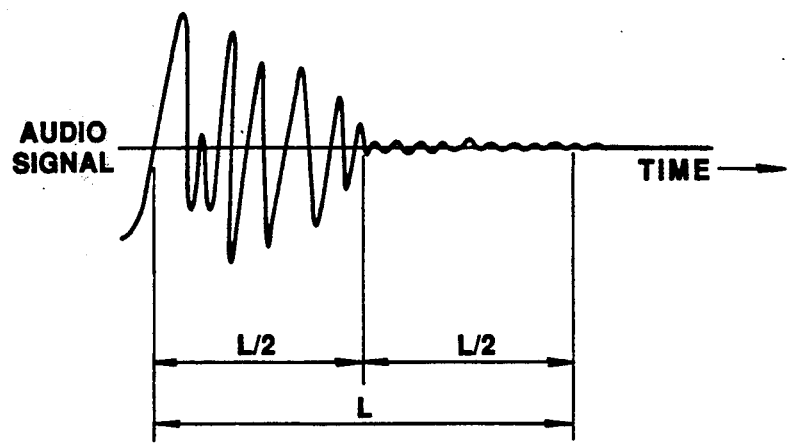
FIG. 2 is a waveform diagram for illustrating the optimum block length of audio signals.

However, the audio and video signals have selected signal properties, such as signal levels, fluctuating drastically with time, as mentioned above, so that, if the signals at the time of fluctuations of the properties are orthogonally converted, it becomes difficult to remove (or reduce) the correlations among the sample values, while it also becomes difficult to control the S/N on the frequency axis. For example, in the case of an audio signal shown in FIG. 2 wherein the signal waveform level or frequency spectrum is changed significantly within a predetermined block length L on the time axis, that is when the time band of the former L/2 in which the signal level is high and the higher harmonics contents of the frequency spectrum and the time band of the latter L/2 in which the signal level is low and higher harmonics contents are low, are within the same block length L, and the orthogonal conversion is performed with such block length L, the spectrum component of the former time band will be dispersed into the latter time band upon encoding such signal.

In view thereof, the apparatus of the present example is provided with buffer memories 11, 12 having a memory capacity corresponding to, for example, L/2 of the memory capacity with respect to the block length L.

That is, audio signals, for example, are supplied to an input terminal 1 of the present example, and the audio signals are stored by a volume corresponding to the block length L/2 in the buffer memory 11. The data stored in the buffer memory 11 are then supplied to a changeover switch 16 which is opened and closed in a controlled manner based on the block length data from the block length determining circuit 15 and thence to a buffer memory 12 having the memory capacity corresponding to L/2 of the block length, where it is stored, at the same time that the next data are stored in the buffer memory 11. The energy values of the signals stored in the buffer memories 11 and 12 are computed in the energy value computing circuits 13, 14 and these energy value data are supplied to the block length determining circuit 15. The two energy values are compared with each other in the block length determining circuit 15. When the difference between the two energy values is more than a predetermined value, that is, when one of the energy values is larger by a predetermined value than the other, and when the difference between the two energy values is less than a predetermined value, the corresponding block length data are output. That is, the block length determining circuit 15 outputs data controlling the changeover switch 16 to be off when the difference between the two energy values is large and controlling the switch 16 to be on when the difference between the two energy values is too small to transmit data. The above mentioned block length data are also supplied to the orthogonal conversion circuit 17 to effect orthogonal conversion on the basis of the block length data.

With the above construction, the sample of the block length L is usually subjected to orthogonal conversion with the changeover switch 16 in the "on" state. That is, when the difference between the above two energy values is small, the changeover switch 16 is turned on, so that the data from the buffer memories 11, 12 are supplied simultaneously to the orthogonal converting circuit 17. In this circuit 17, data of the buffer memories 11, 12 are subjected to orthogonal conversion with the block length L on the basis of the block length data. In this case, there are no signals in one and the same block that are fluctuated significantly in their properties so that the correlations between the samples may be removed (or diminished) during orthogonal conversion to improve the S/N ratio. Conversely, when the signal fluctuations within the block length L are increased within the block length L, the samples with the block length equal to L/2 are subjected to orthogonal conversion with the changeover switch 16 off. That is, when the difference between the above two energy values is large, the changeover switch 16 is turned off, so that only data from the buffer memory 12 are supplied to the orthogonal conversion circuit 17, so that signals having the properties markedly changed cannot exist in one and the same block. In this case, too, the correlation between the sample values may be eliminated (or diminished) at the time of orthogonal conversion to improve the S/N ratio. The frequency spectra may similarly be detected and compared besides the energy values per each divided block L/2. Also, with the above mentioned apparatus, the number of the buffer memories may be increased to more than 2 to increase the number of steps of changes of the block length to deal more delicately with fluctuations in the input signal properties.

With the above described embodiment, even with the voice or video signals, which are likely to be changed significantly with time as to levels or frequency spectra, the S/N ratio may be improved without degrading the S/N ratio of the decoded signal to obtain high quality decoded signals.

Figure 3:
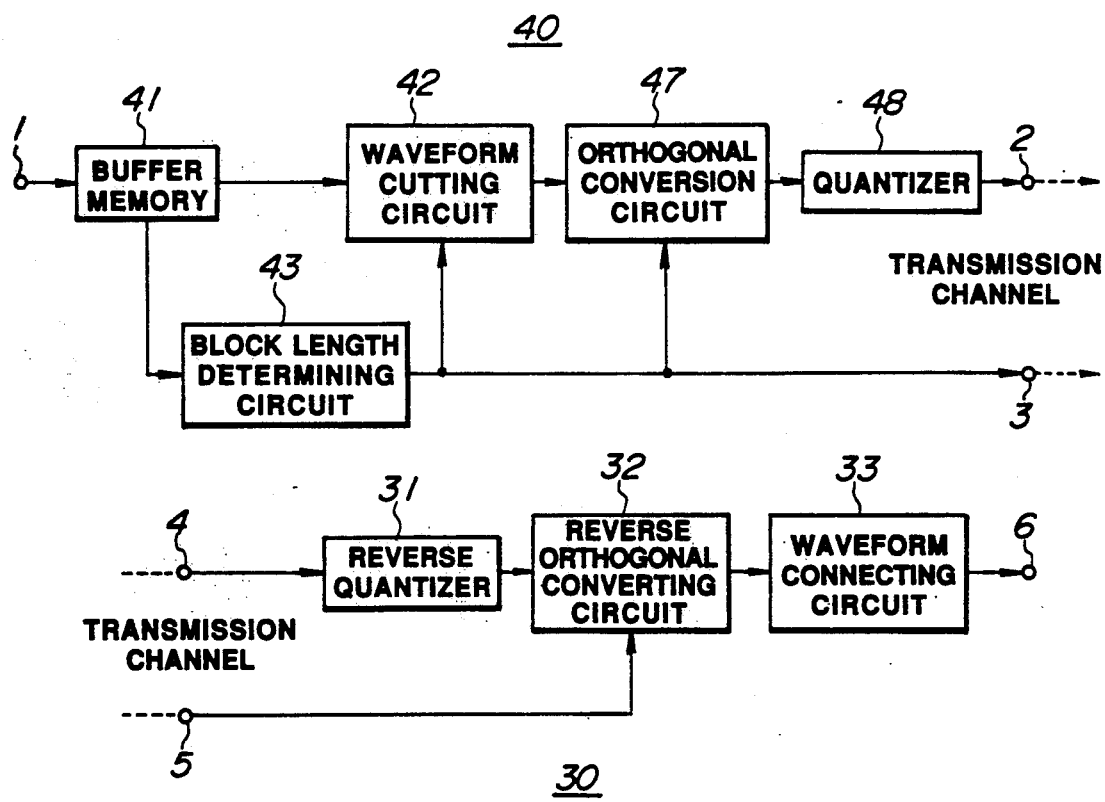
FIG. 3 is a block circuit diagram showing a schematic construction of another embodiment of the present invention.

Meanwhile, with the above embodiment of FIG. 1, L/2 sample data are supplied in parallel to the orthogonal conversion circuit 17 from the buffer memories 11, 12, for clarifying the variable block length operation. However, the present invention may also be applied to a case in which serial input data are converted into blocks in the orthogonal conversion circuit for orthogonal conversion. An example is shown in FIG. 3. In this figure, input signals via input terminal 1 of the encoder 40 are sequentially stored in the buffer memory 41. In the block length determining circuit 43, signals in the buffer memory 41 are analyzed to determine the block length of the discrete Fourier transform effected in the orthogonal conversion circuit 47 to output the block length data. This block length data is supplied to a waveform cutting circuit 42 where the necessary data are taken out sequentially from the past ones from the buffer memory 41 on the basis of the block length data to perform window processing. The waveform cutting block length may be capable of being switched between L and L/2 as mentioned above while the waveform cutting block length may be divided to be finer than L/2 to increase the number of steps of changes in the block length. The thus cut data are transmitted to an orthogonal conversion circuit 47 adapted to achieve discrete Fourier transform on the basis of the above block length data to produce the DFT coefficient from the circuit 47 and the quantizing operation is performed in a quantizer 48. The ensuing operation and the construction in FIG. 3 are the same are as those of FIG. 1 so that the same numerals are affixed to the corresponding portions and the description is omitted. As described above, with the arrangement of encoding serial signals into codes, the effect similar to that of FIG. 1 may be realized by changing the block length of orthogonal conversion within the orthogonal conversion circuit 47 on the basis of the block length data.

The orthogonal conversion may be made not only by discrete Fourier transform but also by Hadamard transform, Karuhnen Leve transform (KLT), discrete cosine transform (DCT) or Legendre transform.

What is claimed is:

1. A signal encoding apparatus for efficient transmission of input signals, wherein the input signals are grouped as signal blocks at a predetermined time interval and the signals of each signal block are converted based on mutually independent conversion axes and subjected to encoding, said apparatus comprising:
   computing means for computing values of a predetermined property of said input signals;
   means for varying block time lengths of said input signals as a function of the computed values of said computing means;
   storage means for storing the input signals in signal blocks of at least two different time lengths in response to said means for varying; and
   means for converting the signals in the form of the signal blocks of at least two different time lengths based on mutually independent conversion axes.

2. A signal encoding apparatus for efficient transmission of input signals, wherein the input signals are grouped as signal blocks at a predetermined time interval and the signals of each signal block are converted based on orthogonal conversion axes and subjected to encoding, said apparatus comprising:
   storage means for transient storage of said input signals;
   computing means for computing energies of input signals held by said storage means;
   block length determining means for determining block time lengths of said input signals depending on the computed results of said computing means;
   means for grouping the input signals into signal blocks depending on the block time length determined by the block length determining means; and
   means for converting the signals thus grouped into blocks using mutually orthogonal conversion axes.

3. A signal encoding apparatus for efficient transmission of input signals, wherein the input signals are grouped as signal blocks at a predetermined time interval and the signals of each group are converted using orthogonal conversion axes, said apparatus comprising:
   a pair of storage means for storage of portions of input signals respectively offset from each other by a predetermined time;
   computing means for computing energies of the portions of the input signals stored in the respective storage means;
   comparator means for comparing the relative energies of said portions of the input signals computed by said computing means; and
   quantizing means for converting the portions of the input signals held by said respective storage means as one signal block using orthogonal conversion axes and encoding the converted signals when the result of comparison is lower than a predetermined value, and for converting said portions of the input signals held by said respective storage means as separate signal blocks using orthogonal conversion axes and quantizing the converted signals when the result of comparison is higher than said predetermined value.

4. A signal transmission apparatus in which input signals are grouped as signal blocks at a predetermined time interval and the signals of each group are converted using mutually independent conversion axes and subjected to encoding, for thereby effecting efficient transmission of the input signals, said apparatus comprising:
   storage means for transient storage of said input signals;
   means for computing relative energies of input signals held by said storage means;
   block length determining means for determining block time lengths of said input signals depending on the computed results of said computing means, said signal blocks having a length depending on the block time length determined by the block length determining means;
   means for converting the signals thus grouped into blocks using mutually independent conversion axes; and
   means for transmitting the converted and encoded input signals and block length data obtained at said block length determining means.

* * * * *